United States Patent
Breitwisch et al.

(10) Patent No.: US 7,505,334 B1
(45) Date of Patent: Mar. 17, 2009

(54) MEASUREMENT METHOD FOR READING MULTI-LEVEL MEMORY CELL UTILIZING MEASUREMENT TIME DELAY AS THE CHARACTERISTIC PARAMETER FOR LEVEL DEFINITION

(75) Inventors: Matthew J. Breitwisch, Yorktown Heights, NY (US); Chung H. Lam, Peekskill, NY (US); Bipin Rajendran, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/128,291

(22) Filed: May 28, 2008

(51) Int. Cl.
*G11C 7/06* (2006.01)
*G11C 7/08* (2006.01)
*G11C 16/26* (2006.01)
*G11C 11/4197* (2006.01)
*G11C 11/4193* (2006.01)
*G11C 16/06* (2006.01)

(52) U.S. Cl. .................. 365/189.15; 365/163; 365/158; 365/148; 365/185.21; 365/202; 365/201; 365/189.07

(58) Field of Classification Search .................. 365/158, 365/171, 173, 148, 185.21, 189.15, 189.07, 365/202, 210.11, 163, 201
See application file for complete search history.

(56) References Cited

U.S. PATENT DOCUMENTS

| | | | | |
|---|---|---|---|---|
| 6,044,019 A | * | 3/2000 | Cernea et al. | ........... 365/185.21 |
| 6,128,239 A | * | 10/2000 | Perner | ......................... 365/209 |
| 6,222,762 B1 | * | 4/2001 | Guterman et al. | ....... 365/185.03 |
| 6,259,644 B1 | * | 7/2001 | Tran et al. | .................... 365/209 |
| 6,707,710 B1 | | 3/2004 | Holden | |
| 6,898,134 B2 | | 5/2005 | Smith et al. | |
| 2001/0048608 A1 | * | 12/2001 | Numata et al. | ............... 365/158 |
| 2002/0008987 A1 | * | 1/2002 | Numata et al. | ............... 365/158 |
| 2004/0095827 A1 | * | 5/2004 | Perner et al. | ................. 365/209 |
| 2007/0002654 A1 | * | 1/2007 | Borromeo et al. | ........... 365/207 |

* cited by examiner

*Primary Examiner*—J. H. Hur
(74) *Attorney, Agent, or Firm*—Cantor Colburn LLP; Vazken Alexanian

(57) ABSTRACT

A method for operating a memory cell in which a variation of the characteristic parameter of the memory cell affects the effective resistance of the memory cell. The method includes measuring a first discharge time of a reference voltage through the memory cell, determining that the first discharge time is less than a minimum discharge time, adding a supplemental capacitor in parallel with the memory cell, adding including coupling the capacitor to the memory cell through a switch, measuring a second discharge time of the reference voltage through the memory cell, storing the second discharge time and determining the value stored in the memory cell based on the second discharge time. Measuring the first and second discharge times includes pre-charging an electronic circuit coupled to the memory cell, activating the memory cell so as to discharge the electronic circuit, at least partially through the memory cell, starting a time measurement when the memory cell is activated, and stopping the time measurement when the voltage level in the electronic circuit falls below a pre-defined reference voltage.

1 Claim, 7 Drawing Sheets

MEASUREMENT METHOD FOR READING MULTI-LEVEL MEMORY CELL UTILIZING MEASUREMENT TIME DELAY AS THE CHARACTERISTIC PARAMETER FOR LEVEL DEFINITION

CROSS-REFERENCE TO RELATED APPLICATIONS

This application contains subject matter which is related to the subject matter of co-pending U.S. patent application Ser. No. 11/857,356 titled "MULTI-LEVEL MEMORY CELL UTILIZING MEASUREMENT TIME DELAY AS THE CHARACTERISTIC PARAMETER FOR LEVEL DEFINITION" filed Sep. 18, 2007, and U.S. patent application Ser. No. 11/857,321 titled "MULTI-LEVEL MEMORY CELL UTILIZING MEASUREMENT TIME DELAY AS THE CHARACTERISTIC PARAMETER FOR LEVEL DEFINITION" filed Sep. 18, 2007, being assigned to the same assignee as this application, International Business Machines Corporation of Armonk, N.Y., and is hereby incorporated herein by reference in its entirety.

BACKGROUND OF THE INVENTION

1. Field of the Invention

The present invention relates to operation of memory storage systems, and more particularly, to reading multi-level memory cells that use time delay as a level characteristic.

2. Description of Background

Typical semiconductor computer memories are fabricated on semiconductor substrates consisting of arrays of large number of physical memory cells. In general, one bit of binary data is represented as a variation of a physical parameter associated with a memory cell. Commonly used physical parameters include threshold voltage variation of Metal Oxide Field Effect Transistor (MOSFET) due to the amount of charge stored in a floating gate or a trap layer in non-volatile Electrically Erasable Programmable Read Only Memory (EEPROM), or resistance variation of the phase change element in Phase-change Random Access Memory (PRAM).

Increasing the number of bits to be stored in a single physical semiconductor memory cell is an effective method to lower the manufacturing cost per bit. Multiple bits of data can also be stored in a single memory cell when variations of the physical parameter can be associated with multiple bit values. This multiple bits storage memory cell is commonly known as a Multi-Level Cell (MLC). Significant amount of effort in computer memory device and circuit designs is devoted to maximize the number of bits to be stored in a single physical memory cell. This is particularly true with storage class memory such as popular non-volatile Flash memories commonly used as mass storage devices.

The basic requirement for multiple bit storage in a semiconductor memory cell is to have the spectrum of the physical parameter variation to accommodate multiple non-overlapping bands of values. The number of bands required for an n-bit cell is $2^n$. A 2-bit cell needs 4 bands, a 3-bit cell needs 8 bands and so forth. Thus, the available spectrum of a physical parameter in a semiconductor memory cell is typically the limiting factor for multiple bit memory storage.

In addition to the limiting spectrum width, the ability for a memory controller or memory device to program or read a characteristic parameter in a memory cell diminishes as the number of levels in a memory cell increases. Factors such as electrical noise, sense voltage disturbance, and spectrum width all interfere with the accuracy of a characteristic parameter value read from a memory cell. It is desirable to devise a method to program and read a characteristic parameter to many distinct levels, while minimizing the perturbation to the parameter during read/write processes involving the memory cells.

SUMMARY OF THE INVENTION

One embodiment of the present invention is directed to a method for operating a memory cell in which a variation of the characteristic parameter of the memory cell affects the effective resistance of the memory cell. The method of this embodiment includes measuring a first discharge time of a reference voltage through the memory cell; determining that the first discharge time is less than a minimum discharge time; adding a supplemental capacitor in parallel with the memory cell, adding including coupling the capacitor to the memory cell through a switch; measuring a second discharge time of the reference voltage through the memory cell; storing the second discharge time; and determining the value stored in the memory cell based on the second discharge time. Measuring the first and second discharge times includes precharging an electronic circuit coupled to the memory cell, activating the memory cell so as to discharge the electronic circuit, at least partially through the memory cell, starting a time measurement when the memory cell is activated, and stopping the time measurement when the voltage level in the electronic circuit falls below a pre-defined reference voltage.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

Figure 1:
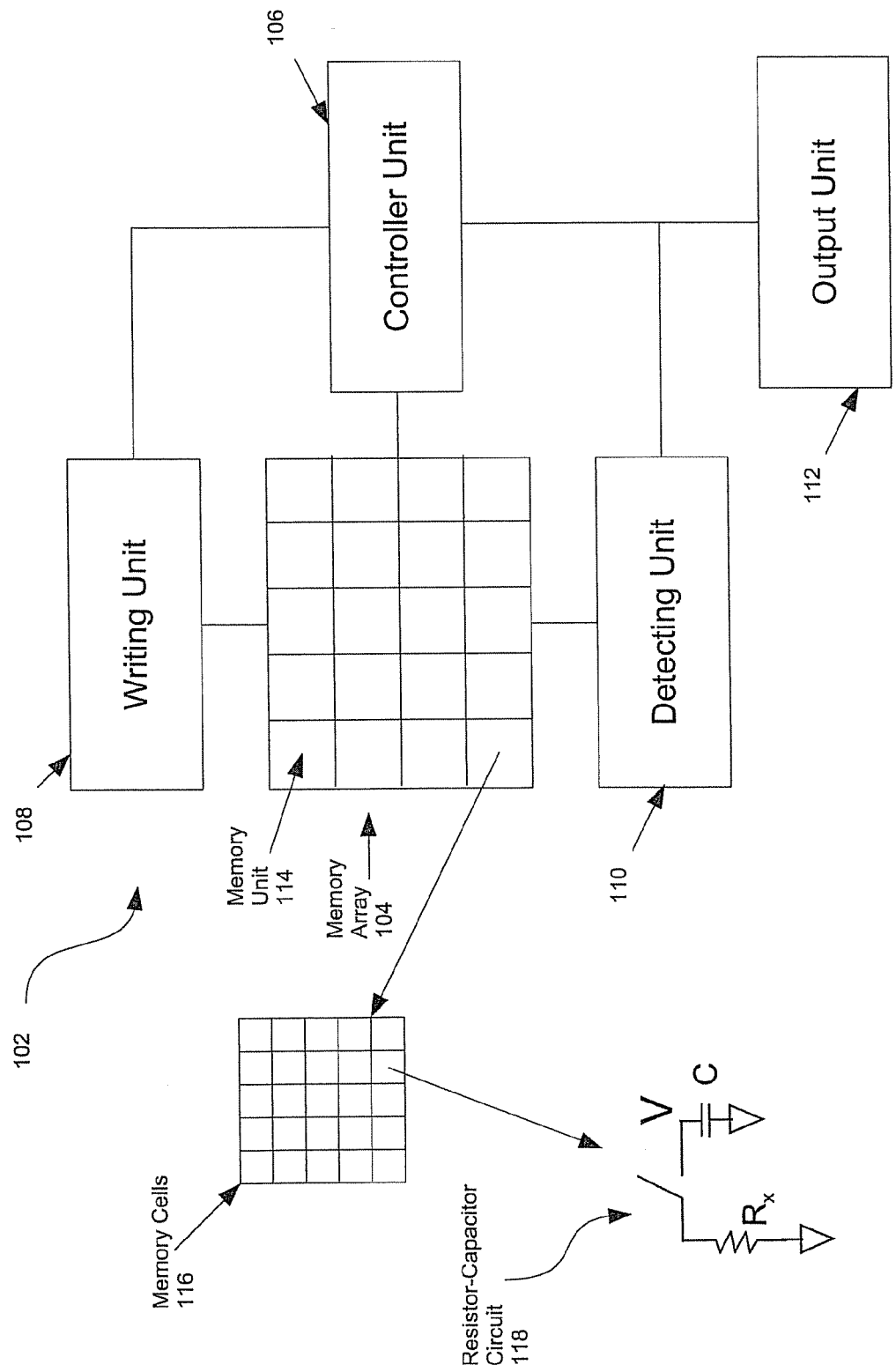
FIG. 1 illustrates a particular embodiment of a memory array in accordance with the present invention.

The detailed description explains the preferred embodiments of the invention, together with advantages and features, by way of example with reference to the drawings.

DETAILED DESCRIPTION OF THE INVENTION

Aspects of the present invention will be described with reference to FIGS. 1-7. When referring to the figures, like elements shown throughout are indicated with like reference numerals.

FIG. 1 illustrates a memory system 102 according to one embodiment of the present invention. The memory system 102 includes a memory array 104, a controller unit 106, a writing unit 108, a detecting unit 110, and an output unit 112.

The memory array 104 contains a plurality of memory cells 116, with each memory cell 116 forming, at least partially, an electronic circuit 118. In a particular embodiment of the invention, the electronic circuit 118 is a resistor-capacitor circuit. The memory cells 116 may be packaged as individual memory cells 116 in the memory array 104 or they may be packaged as memory units 114 comprised of a plurality of memory cells 116. Furthermore, the controller unit 106, the writing unit 108, the detecting unit 110, and the output unit 112 may be separately packed or incorporated with the memory array 104.

The memory cells 116 are not limited to a particular memory storage technology. Those skilled in the art will recognize that different memory technologies use different characteristic parameters to represent data. For example Phase Change Memory (PCM) and Resistive Random Access Memory (RRAM) technology use resistance variation as a characteristic parameter to represent binary data. Further examples of characteristic parameters contemplated by the present invention include the number of electrons in the floating gate of a MOSFET, which is measured as a shift in the MOSFET's threshold voltage (Flash memory), and the induced magnetization of a ferromagnetic layer, which is measured as electrical resistance of the memory cell (MRAM). In all these cases and other similar embodiments, it is possible to associate the characteristic parameter of the memory cell with an effective resistance of the memory cell, the effective resistance defined as the ratio of a properly chosen voltage to the current that flows through the memory cell when that voltage is applied across it.

Each memory cell 116 in the memory array 104 is configured to represent at least two binary values. Each binary value is assigned a target discharge time. The target discharge time is the approximate time it takes for the voltage in the electronic circuit 118 to drop to a predetermined level. In a particular embodiment of the invention, the electronic circuit 118 is a resistor-capacitor circuit. The effective resistance of the memory cell forms the resistor and the intrinsic capacitance of the metal line (or bit line) accessing the memory cell forms the capacitor for the said resistor-capacitor circuit. For example, the characteristic parameter stored in PCM memory cells 116 is the crystalline/amorphous phase of the phase change material. The amorphous phase of the memory cell 116 creates a relatively high resistance in the electronic circuit 118 which causes a longer electron discharge time. The crystalline phase of a PCM memory cell 116 has a relatively low resistance in the electronic circuit 118 which results in a shorter electron discharge time. The different lengths of the electron discharge times can be measured and a target can be made for the electron discharge times in the electronic circuit 118. These different target discharge times are then assigned to each of the possible binary value represented in the memory cells 116.

In one embodiment of the present invention, the controller unit 106 forms the electronic circuit 118 with a target memory cell 116. Additionally, the controller unit 106 also assigns the different target discharge times to each of the possible binary values represented in the memory cells 116 of the memory array 104.

The characteristic parameter storage in memory cells 116 is performed by the controller unit 106 and the writing unit 108. A specific binary value is requested by, for example, a Central Processing Unit (CPU) of a computer, to be represented by the target memory cell 116. The writing unit 106 then writes the characteristic parameter in the target cell. In one embodiment, this is done by determining the target discharge time and recursively writing the characteristic parameter in the target memory cell 116 by a pre-defined algorithm and measuring the electron discharge time until the electron discharge time is substantially equal to the target discharge time.

In a particular embodiment of the invention, a request is made by the CPU to retrieve the binary value represented by the target memory cell 116. The controller unit 106 forms an electronic circuit 118 with the target memory cell 116. The electronic circuit 118 is charged to a pre-charge voltage and then discharged. At the beginning of the discharge, the detecting unit 110 begins a time measurement. Once the voltage falls to a predetermined level the detecting unit 110 ends the time measurement.

The output unit 112 compares the electron discharge time to the target discharge times and outputs the binary value associated with the target discharge time closest to the electron discharge time measured by the detecting unit 110. In one embodiment of the present invention, the output unit 112 utilizes statistical methods, such as maximum likelihood estimators, in determining the target discharge time closest to the measured electron discharge time.

Figure 2:
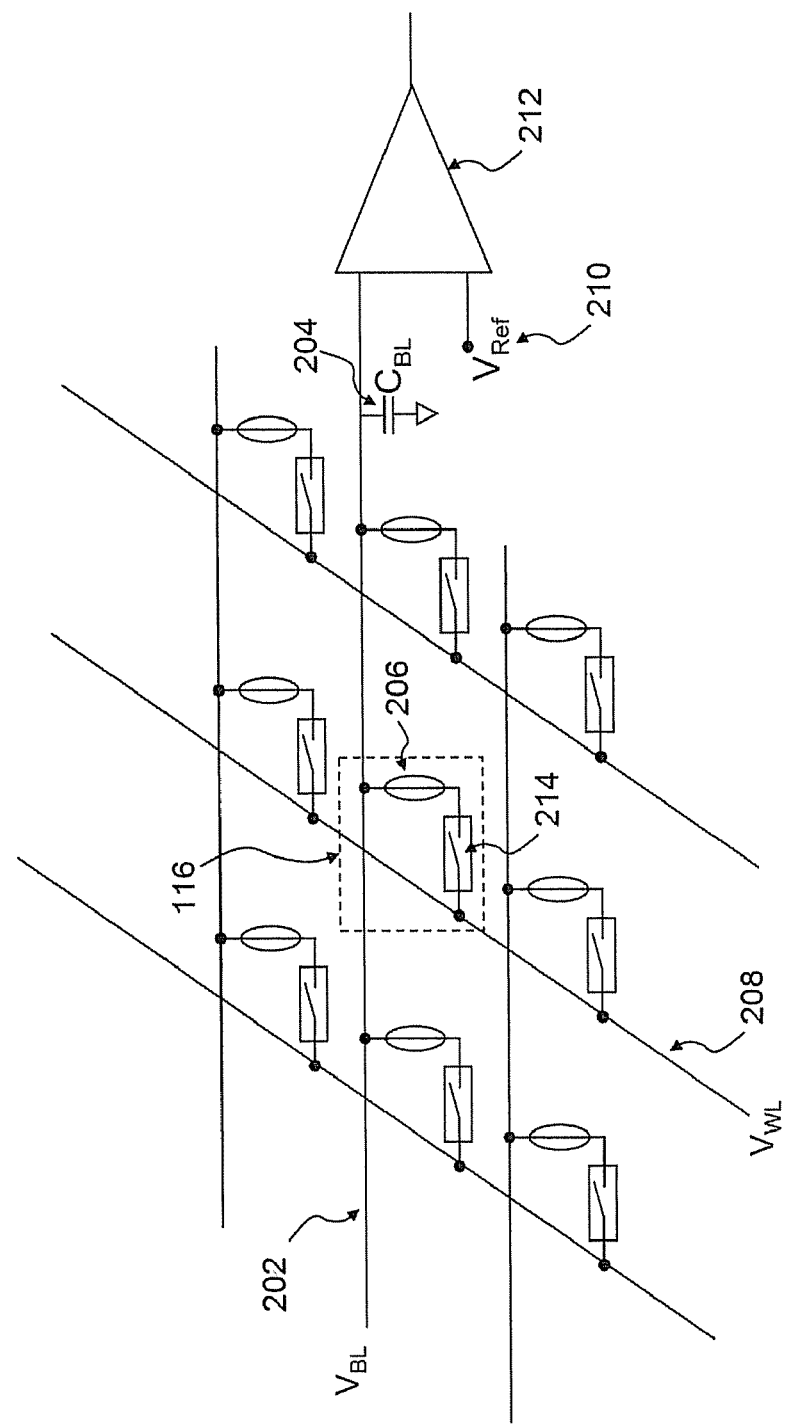
FIG. 2 illustrates a particular embodiment of an electronic circuit in accordance with the present invention.

Turning to FIG. 2, the electronic circuit 118 of the memory array is shown in more detail. The electronic circuit 118 for the selected memory cell 116 is comprised of a bit-line 202, a bit-line capacitor 204, a resistor 206, a word-line 208, a reference voltage source 210, a comparator 212 and an access device 214. The access device can be a MOSFET, a PN junction diode, or a bipolar junction transistor. The intrinsic capacitance of the bit-line 202 is represented by the bit-line capacitor 204. The bit-line capacitor 204 is connected to the word-line 208 through the effective resistance of the memory cell modeled by the resistor 206 and the access device 214. The comparator 212 is connected to the reference voltage source 210 which is set to the predetermined voltage level. When the bit-line voltage and reference voltage are equal, the comparator 212 signals to stop the timer measuring the discharge time.

The resistor 206 and capacitor 204 include, respectively, the inherent resistance and inherent capacitance in the memory cell. In a particular embodiment of the invention, the resistance value of the memory cell depends on the characteristic parameter value. For example, as stated above for the PCM memory cells, the characteristic parameter is the crystalline/amorphous state of the phase change material. A highly amorphous state of the phase change material creates a higher resistance and a highly crystalline state of the phase change material results in a lower resistance. Also stated above, the resistor 206 is not limited to one particular type of characteristic parameter.

In one embodiment of the invention, the memory cell is read by first pre-charging the bit-line capacitor 204 to a predetermined voltage level. The electron discharge time measurement begins when the word-line 208 is turned on which causes the charge stored in the bit-line capacitor 204 to discharge through the resistor 206 and the access device 214. Using the PCM example again, the higher resistance of amorphous phase change material will result in a longer electron discharge time than the lower resistance of crystalline phase change material. The comparator 212 receives the bit-line voltage from the bit-line 202 and the reference voltage from the reference voltage source 210. When the bit-line voltage drops to the reference voltage, the time measurement ends.

In another embodiment of the invention, where the memory element is a floating gate MOSFET, the charge stored in the gate oxide is the characteristic parameter. The effective resistance of the memory element is the ratio of the voltage applied between the drain and source terminals of the MOSFET to the current flowing in response to that applied voltage through the transistor. As described herein, the binary value represented by the memory cell is determined by measuring the discharge time through the effective R-C circuit.

Figure 3:
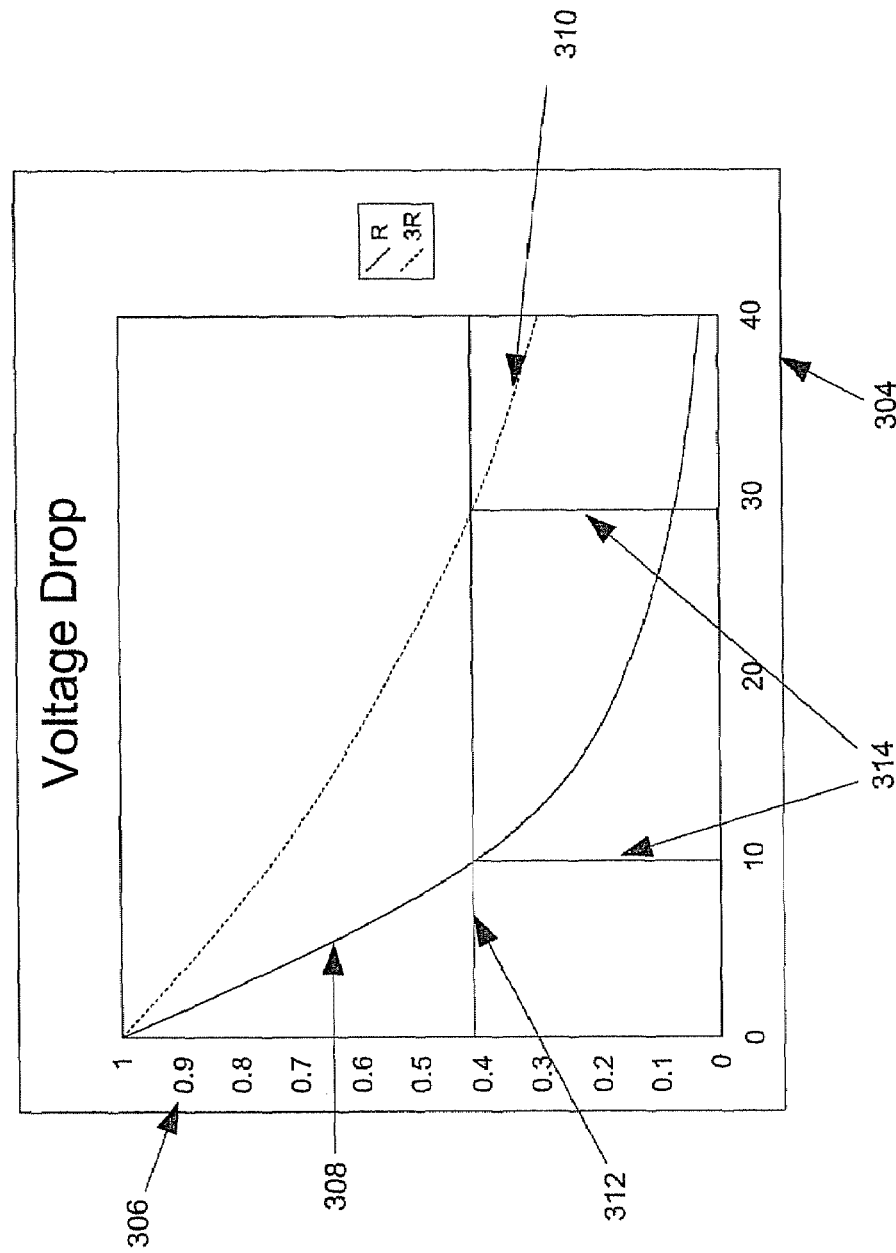
FIG. 3 illustrates electron discharge times relative to resistance in a memory cell.

FIG. 3 illustrates a voltage drop chart for the bit-line voltage. The chart illustrates the electron discharge time in the bit-line for a first resistance level 308 containing an arbitrary resistance, and a second resistance level 310 containing a resistance three times of the first. Time 304 (in nanoseconds) is shown on the x-axis and voltage level 306 relative to the bit-line pre-charge voltage is on the y-axis.

The voltage level 306 with respect to time 304 can be calculated by the formula, $$V(t)=V(0)\cdot\exp[-t/(R_xC)], x=1, \ldots, n.$$

Here, V(t) is the voltage level 306 at time t, V(0) is the pre-charge voltage, R is the resistance level of the memory cell dependent on the characteristic parameter stored in the memory cell, C is the capacitance of the circuit, and n is the number of characteristic parameter levels possibly stored in the memory cell.

As described above, a predetermined voltage level 312 is set in the circuit as a fraction of the pre-charge voltage. In this arbitrary example, the predetermined voltage level 312 is set at 0.4V(0) and V(0)=1. As shown, memory cells set to the first resistance level 308 take 10 nanoseconds for the voltage to drop to the predetermined voltage level 312, while memory cells set to the second resistance level 310 take 30 nanoseconds for the voltage to drop to the predetermined voltage level 312. These electron discharge times 314 are measurably different and can be set as target discharge times associated with binary values. Thus, the memory cells can be read using these electron discharge times 314 instead of detecting the characteristic parameter stored in the memory cells.

Figure 4:
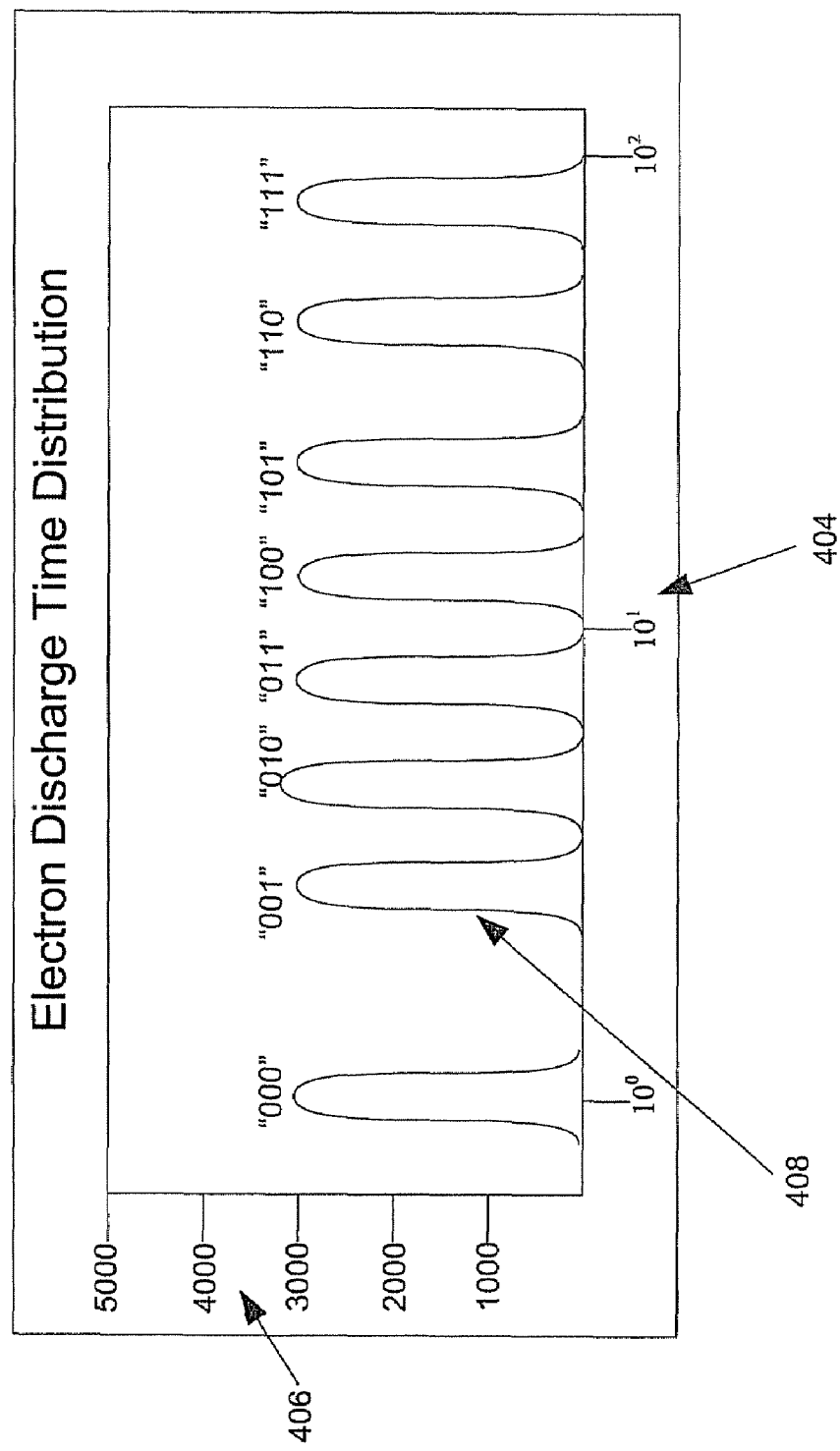
FIG. 4 illustrates an electron discharge time distribution in a memory array in accordance with the present invention.
Figure 5:
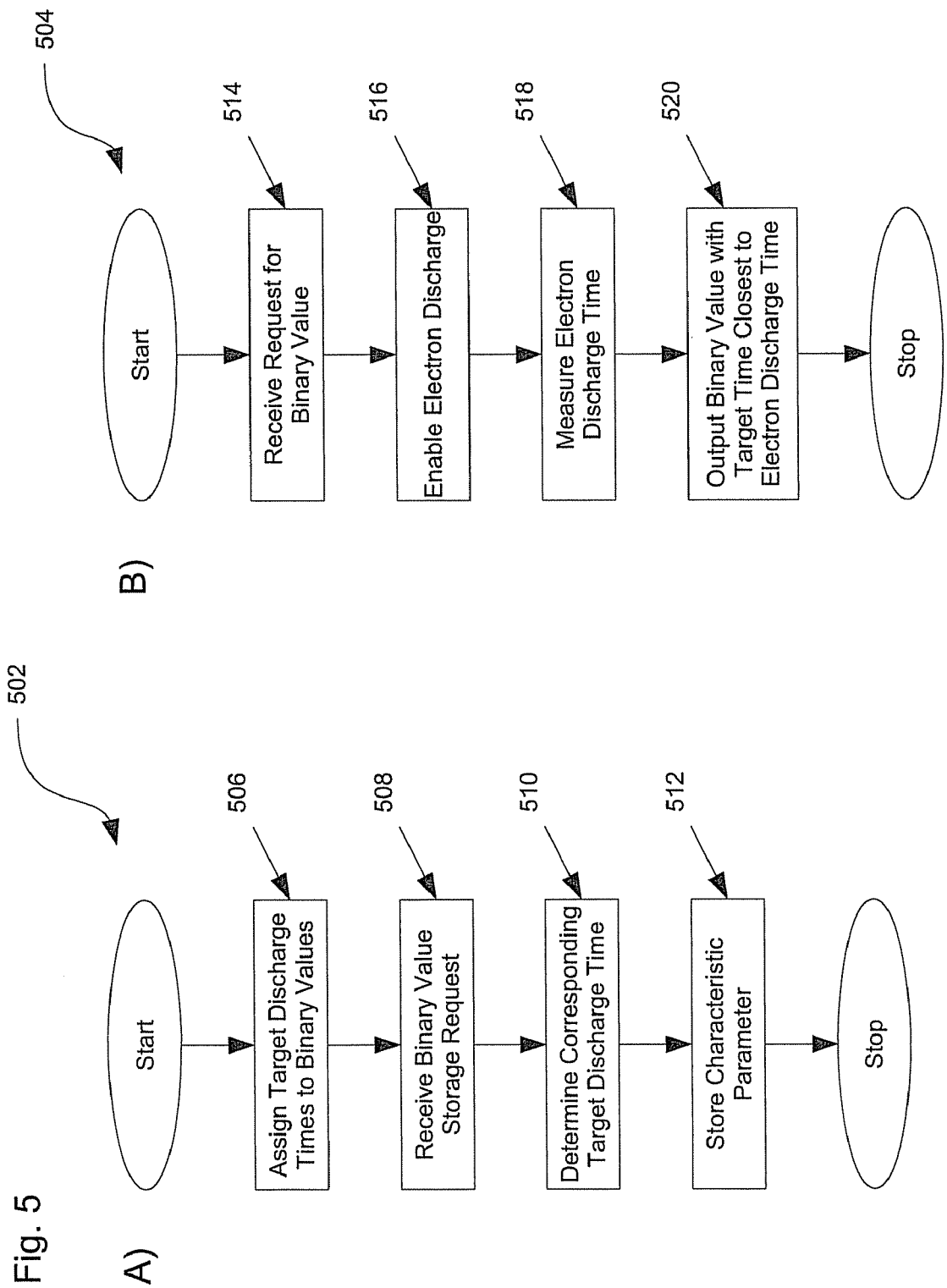
FIG. 5 illustrates storage operation flow in accordance with one embodiment of the present invention.

Turning to FIG. 4, an electron discharge time distribution for a collection of memory cells incorporating the effect of electrical noise and variations in the intrinsic parameters of the discharge circuit is shown. Time (in nanoseconds) 404 is on the x-axis and the number of memory cells 406 with a particular electron discharge time is on the y-axis. Note that the electron discharge time distribution 402 shows a particular memory system with eight levels. Those skilled in the art will realize that a system with more than one level may be implemented in accordance with the present invention.

As mentioned above, in a particular embodiment of the invention, the writing unit recursively writes the characteristic parameter to the memory cell so that the electron discharge time of the memory cell is substantially equal to the target discharge time associated with the binary value being represented by the memory cell. In practice however, the characteristic parameter values form Gaussian distribution curves 408 centered about the target discharge time. This is typically due to natural variations during memory cell manufacturing and characteristic parameter value shifts as a result of environmental factors over time.

The memory system can use the distribution curves 408, or a target discharge time range, as representation of binary values. The binary value represented by a specific memory cell can be outputted even if the electron discharge time is not equal to any target discharge time. The electron discharge time can be fitted into the closest distribution curve 408 with statistical methods known to those skilled in the art and the binary value represented by the distribution curve 408 can be read from the memory cell. For example, a memory cell discharge time centered at 10 nsec can be assigned a binary value of "000". The next discharge time distribution, centered at 30 nsec, is assigned a binary value of "001", and so on.

FIG. 5A illustrates storage operations 502 in an embodiment of the invention. The process flow beings at assigning operation 506. At the assigning operation 506, different target discharge times are assigned to every possible binary value represented by memory cells in the system. In one particular embodiment, the controller unit is assigned the target time delays to the binary values. As mentioned above, the times assigned to the binary values are across ranges so that electron discharge times that are not exactly equal to the closest target discharge time can be still considered equivalent to the target discharge time. After the target discharge times have been assigned to the binary values, control moves to receiving operation 508.

At the receiving operation 508, the memory system receives a request from the CPU to store a specific binary value. Additionally, the CPU or controller unit typically provides a memory address for the memory array to store the binary value. After the target memory cell has been identified and the binary value has been chosen, control passes to determining operation 510.

At the determining operation 510, the target time delay corresponding to the binary value being stored is determined. In one embodiment of the invention, the target time delay can be determined by either the writing unit or the controller unit. Various methods may be used to correlate binary values to target delay times. For example, a lookup table may be used to map binary values to target delay times. After the determining operation 510 is complete, control moves to storing operation 512.

At the storing operation 512, a characteristic parameter value is stored in the memory cell such that the electron discharge time through the said memory cell is substantially equal to the target discharge time. In one embodiment, this might involve a recursive algorithm, where characteristic parameter values are recursively stored in the target memory cell and the electron discharge times are read until the electron discharge time is substantially equal to the target discharge time associated with the binary value being stored. Those skilled in the art will realize this can be done with a simple circuit where the characteristic parameter value is stored and the electron discharge time is measured. If the electron discharge time is not equal to the target discharge time a different characteristic parameter value is stored to the memory cell. After the correct characteristic parameter value has been stored the storage operations 512 end.

FIG. 5B illustrates the reading operations 504 in an embodiment of the invention. The reading operations 504 begin at receiving operation 514. At the receiving operation 514, a request for the stored binary value in a memory cell is received. The target memory cell is located and the electronic circuit is formed with the memory cell. After the electronic circuit is formed, the control passes to enabling operation 516.

At the enabling operation 516, the system enables an electron discharge. In one embodiment of the invention, the system pre-charges the bit-line in the electronic circuit and turns on the word-line in the circuit, thereby causing the capacitor to discharge. It is contemplated that other electronic circuits equivalent to resistor-capacitor circuits may utilize the present invention. When the electron discharge begins, the control passes to measuring operation 518.

At the measuring operation 518, the electron discharge time is measured. In one embodiment of the invention, the electron discharge time measurement begins when the word-line is turned on in the enabling operation 516. The electron discharge time measurement ends when the bit-line voltage falls to the predetermined voltage level. After the electron discharge time has been measured, control moves on to output operation 520.

At the output operation 520, the target discharge time closest to the measured electron discharge time is determined and the associated binary value is outputted to the CPU. The electron discharge time, as mentioned above, need not exactly equal the closest target discharge time. For example, utilizing statistical operations known to those skilled in the art, the correct target discharge time can be determined by the measured electron discharge time. When the binary value has been outputted, the reading operations 504 end.

Figure 6:
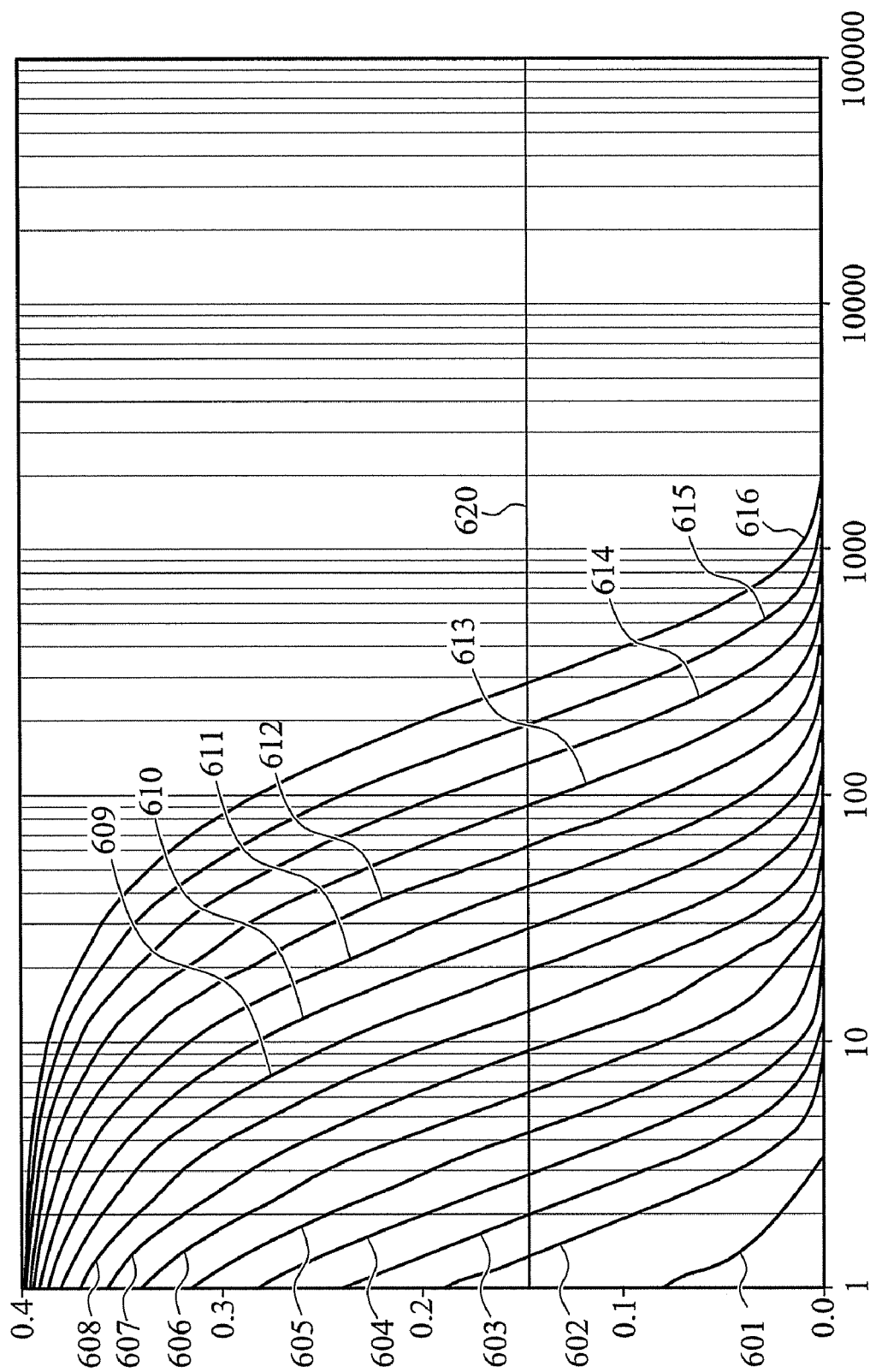
FIG. 6 illustrates decay curves for various values that may be stored in a memory cell.

FIG. 6 is a graph that shows the bit line voltage decays for various levels in a multi-level memory cell. The x-axis represents time in nanoseconds and the y-axis represents voltage in volts. The voltage is measured across the bit line capacitor 204 of FIG. 2 and shall be referred to herein as $V_{bl}$.

The graph of FIG. 6 includes a first curve 601 that represents the discharge time vs. voltage $V_{bl}$ for a binary 0000 stored in a memory cell. The graph of FIG. 6 also includes a second curve 602 that represent the discharge time vs. voltage $V_{bl}$ for a binary 0001 stored in a memory cell. In a similar manner, the graph of FIG. 6 also includes a third curve 603, a fourth curve 604, a fifth curve 605, a sixth curve 606, a seventh curve 607, an eighth curve 608, a ninth curve 609, an tenth curve 610, an eleventh curve 611, a twelfth curve 612, a thirteenth curve 613, a fourteen curve 614, a fifteenth curve 615 and a sixteenth curve 616 which correspond, respectively, to the binary values 0010 to 1111. These values may be stored, for example, in a memory cell capable of storing 16 distinct states. The graph of FIG. 6 also includes a predetermined voltage level 620 set to 0.15V and V(0) is set to 0.4V.

As can be seen from FIG. 6, the lower binary values cross the predetermined voltage level 620 much closer in time to one another than do higher binary values. For example, the time difference between the predetermined voltage level 620 crossings of the third curve 603 and the fourth curve 604 is about 1 nanosecond (ns) while the time difference between the predetermined voltage level 620 crossings of the fifteenth curve 615 and the sixteenth curve 616 is about 100 ns. Thus, at lower binary values, resolution of the values may be more difficult.

As discussed above, the voltage of the bit line $V_{bl}$ varies over time such that $V_{bl}(t)=V(0) \cdot \exp[-t/(R_x C)]$, $x=1, \ldots, n$, where C is the intrinsic capacitance of the bit line. For the representation shown in FIG. 6, C is assumed to be on the order of about 25 femto Farads (fF). Further, solving the equation above the time, it can be seen that increasing the value of C will decrease the rate of decay and thus spread the curves apart from one another on the x axis. However, if the value of C is increase too great, the decay times may become too slow for practical usage. Embodiments of the present invention may keep decay times low enough for practical usage.

As discussed above, a time may be used to measure the discharge times. It will be understood that the time could merely be a counter that records the number of clock cycles from when the bit line is charged until the predetermined voltage level is met. As such, clock cycles (or counts) could also be used as a measure of time because each clock cycle has a specified period.

To solve the resolution problem and keep discharge times within an acceptable range, aspects of the present invention may first perform a read by examining a discharge time required for $V_{bl}$ to equal the reference voltage. If that time is below a certain threshold, it may be assumed that the resolution is not enough to discern the value represented by the memory cell. Placing an additional capacitor in parallel with $C_{bl}$ will create a total capacitance C that is greater than $C_{bl}$ and, thus, increase the decay time. This decrease in decay time, consequently, increases the resolution. Thus, if a second read is performed for values that have decay times below a certain time (or number of counts) that includes an additional capacitor in parallel with $C_{bl}$ the resolution of that reading will be increased. To that end, an aspect of the present invention is directed to a method of reading that includes adding a capacitor between the bit line if a decay time is found, on a first read, to be too fast (i.e., the counts required is below a certain threshold).

Figure 7:
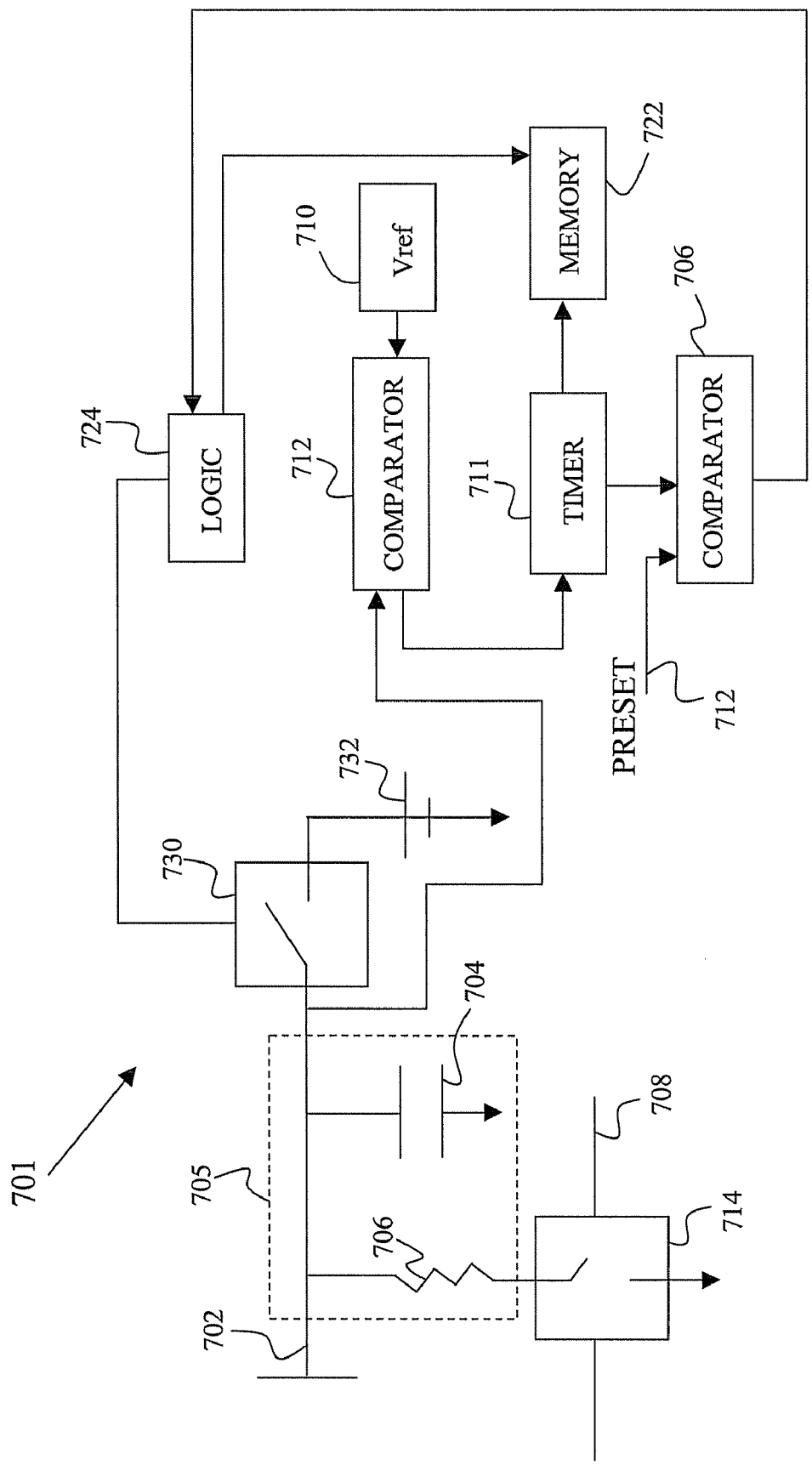
FIG. 7 illustrates a particular embodiment of an electronic circuit in accordance with the present invention.

FIG. 7 shows a circuit 701 according to one embodiment of the present invention. The circuit 701 for the selected memory cell 705 (shown as a resistor and a capacitor) is comprised of a bit-line 702, a bit-line capacitor 704, a resistor 706, a word-line 708, a reference voltage source 710, a first comparator 712 and an access device 714. The access device 714 can be a MOSFET, a PN junction diode, or a bipolar junction transistor. The intrinsic capacitance of the bit-line 702 is represented by the bit-line capacitor 704. The bit-line capacitor 704 is connected to the word-line 708 through the effective resistance of the memory cell 705, modeled by the resistor 706, and the access device 714. The comparator 712 is connected to the reference voltage source 710 which is set to the predetermined voltage level. When the bit-line voltage and reference voltage are equal, the comparator 712 signals to stop the timer 711 measuring the discharge time. In some embodiments, the timer 711 may measure time and in other embodiments the timer 711 may measure clock counts.

In one embodiment of the invention, the memory cell is read by first pre-charging the bit-line capacitor 704 to a predetermined voltage level. The electron discharge time measurement begins when the word-line 708 is turned on which causes the charge stored in the bit-line capacitor 704 to discharge through the resistor 706 and the access device 714. Using the PCM example again, the higher resistance of amorphous phase change material will result in a longer electron discharge time than the lower resistance of crystalline phase change material. The comparator 712 receives the bit-line voltage from the bit-line 702 and the reference voltage from the reference voltage source 710. When the bit-line voltage drops to the reference voltage, the time measurement ends.

According to this embodiment, a second comparator 726 is coupled to the timer 711. The second comparator 726 is also coupled to a preset reference value 740 (minimum discharge time). After the time measurement has ended, the value stored in the timer 711 is compared with a minimum discharge time 740. The minimum discharge time 740 may be expressed as time value or a number of clock cycles. If the value in the timer 711 exceeds the minimum value, a logic block 724 causes the value from the timer 711 to be stored in a memory unit 722. The storing of the value at this stage indicates that the value was correctly read in the first instance. That is, because the value exceeded the minimum discharge time, the resolution of the value is assumed to be sufficient so that the value is certain. As discussed above, however, if the value is too small, confidence that the value has been correctly read may decrease.

According to this embodiment, if the value stored in the timer 711 is less than the minimum discharge time 740, the value is not stored in memory. Rather, logic block 724 causes switch 730 to close. Closing switch 730 introduces supplemental capacitor 732 into the circuit 701 in parallel with memory cell capacitor 704. After the switch 730 has been closed, the circuit 701 is read as described above. As described above, the supplemental capacitor serves to increase the time required for the pre-charge voltage to fall to the reference voltage. This increase in time may increase the resolution between different binary values that may be stored in a multi-level cell.

Those of skilled in art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans can implement the described functionality in varying ways for each particular application, but such implementation decisions should not be interpreted as causing a departure from the scope of the present invention.

The various illustrative logical blocks, modules, and circuits described in connection with the embodiments disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor can be a microprocessor, conventional processor, controller, microcontroller, state machine, etc. A processor can also be implemented as a combination of computing devices, e.g., a combination of a DSP and a microprocessor, a plurality of microprocessors, one or more microprocessors in conjunction with a DSP core, or any other such configuration. In addition, the term "processing" is a broad term meant to encompass several meanings including, for example, implementing program code, executing instructions, manipulating signals, filtering, performing arithmetic operations, and the like.

The steps of a method or algorithm described in connection with the embodiments disclosed herein can be embodied directly in hardware, in a software module executed by a processor, or in a combination of the two. A software module can reside in RAM memory, flash memory, ROM memory, EPROM memory, EEPROM memory, registers, hard disk, a removable disk, a CD-ROM, a DVD, or any other form of storage medium known in the art. A storage medium is coupled to the processor such that the processor can read information from, and write information to, the storage medium. In the alternative, the storage medium may be integral to the processor. The processor and the storage medium can reside in an ASIC. The ASIC can reside in a user terminal. In the alternative, the processor and the storage medium can reside as discrete components in a user terminal.

The modules can include, but are not limited to, any of the following: software or hardware components such as software object-oriented software components, class components and task components, processes, methods, functions, attributes, procedures, subroutines, segments of program code, drivers, firmware, microcode, circuitry, data, databases, data structures, tables, arrays, or variables.

Having described preferred embodiments for multi-level memory cell utilizing measurement discharge time as the characteristic parameter for level definition (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A method for operating a memory cell in which a variation of the characteristic parameter of the memory cell affects the effective resistance of the memory cell, the method comprising:
measuring a first discharge time of a reference voltage through the memory cell;
determining that the first discharge time is less than a minimum discharge time;
adding a supplemental capacitor in parallel with the memory cell, adding including coupling the capacitor to the memory cell through a switch;
measuring a second discharge time of the reference voltage through the memory cell;
storing the second discharge time; and
determining the value stored in the memory cell based on the second discharge time;
wherein measuring the first and second discharge times includes pre-charging an electronic circuit coupled to the memory cell, activating the memory cell so as to discharge the electronic circuit, at least partially through the memory cell, starting a time measurement when the memory cell is activated, and stopping the time measurement when the voltage level in the electronic circuit falls below a pre-defined reference voltage.

* * * * *